United States Patent [19]
Olson et al.

[11] Patent Number: 5,166,761
[45] Date of Patent: Nov. 24, 1992

[54] TUNNEL JUNCTION MULTIPLE WAVELENGTH LIGHT-EMITTING DIODES

[75] Inventors: Jerry M. Olson, Lakewood; Sarah R. Kurtz, Golden, both of Colo.

[73] Assignee: Midwest Research Institute, Kansas City, Mo.

[21] Appl. No.: 678,230

[22] Filed: Apr. 1, 1991

[51] Int. Cl.$^5$ .............................................. H01L 33/00
[52] U.S. Cl. ......................................... 257/46; 257/94; 257/96; 257/97; 257/201; 257/79; 257/104
[58] Field of Search ............... 357/17, 16, 30 J, 12; 250/211 R, 212, 213 R

[56] References Cited

U.S. PATENT DOCUMENTS

| | | | |
|---|---|---|---|
| 3,611,069 | 10/1971 | Galginaitus et al. | 317/235 R |
| 3,752,713 | 8/1973 | Sakuta et al. | 357/17 X |
| 3,938,172 | 2/1976 | Lockwood | 357/17 X |
| 4,296,425 | 10/1981 | Nishizawa | 357/17 |

FOREIGN PATENT DOCUMENTS 63-299382  12/1988  Japan ...................................... 357/17

OTHER PUBLICATIONS

Lynch et al, "Planar Beam-Lead Gallium Arsenide Electroluminescent Arrays", IEEE Transactions on Electron Devices, vol. ED-14, No. 10, Oct. 1967, pp. 705-709.

Shang, "PNPN Light Emitting Diode," *IBM Technical Disclosure Bulletin*, vol. 14, No. 4, Sep. 1971, 1325-1326.

Lockwood et al, "The GaAs P-N-P-N Laser Diode," *IEEE Journal of Quantum Electronics*, Jul. 1974, pp. 567-569.

*IEEE Transactions on Electron Devices*, vol. ED-14, No. 10, (Oct. 1967), Lynch et al., pp. 705-709.

*Primary Examiner*—William Mintel
*Attorney, Agent, or Firm*—Ken Richardson

[57] ABSTRACT

A multiple wavelength LED having a monolithic cascade cell structure comprising at least two p-n junctions, wherein each of said at least two p-n junctions have substantially different band gaps, and electrical connector means by which said at least two p-n junctions may be collectively energized; and wherein said diode comprises a tunnel junction or interconnect.

9 Claims, 3 Drawing Sheets

TUNNEL JUNCTION MULTIPLE WAVELENGTH LIGHT-EMITTING DIODES

CONTRACTUAL ORIGIN OF THE INVENTION

The United States Government has rights in this invention under contract No. DE-AC02-83H10093 between the U.S. Department of Energy and the Solar Energy Research Institute, a division of the Midwest Research Institute.

FIELD OF THE INVENTION

The invention pertains to a multiple layered, single structure of several light emitting diodes (LEDs) of varying band gaps. This structure is at least a two-terminal device with tunnel junction, and made by first growing thin films of alternative p- and n-doped materials of a low band gap and finishing with the step of growing thin films of alternating p-and n-doped materials of a high band gap.

BACKGROUND OF THE INVENTION

Because of their size and low power requirements, semiconductor light-emitting diodes occupy a large role as components in visual display systems, and there is increasing demand for components for new and improved visual display systems which will exhibit greater capabilities without having to add additional components or elements to the visual display systems.

In some display systems, a number of ways of fabricating arrays containing components that emit light of the same wavelength are known. One such article appears in the October 1967 issue of IEEE Transactions on Electron Devices, Vol. ED-14, No. 10, wherein there is described the fabrication of integrated arrays of electroluminescant diodes.

U.S. Pat. No. 3,611,069 discloses a method for making arrays of gallium arsenide phosphide diodes for use in alphanumeric light displays.

As the level of expertise in the fabrication and deployment of visual displays rose, demand for multiple color displays as an extension of this technological area surfaced with increasing intensity. It then became apparent that an obvious method for obtaining different colors could be achieved by adding additional diodes to the array; however, a drawback in the use of additional diodes resided in the disadvantage of having to add to the number of component or element positions in the array, and thereby, create further complexity and difficulty in the fabrication process.

U.S. Pat. No. 3,611,069 pertains to providing devices of multiple-layered semiconductive regions of differing conductivity forming light-emitting PN junctions at the interface of two different conductivity-type regions. In this multiple-junction structure, each diode junction ;can be independently addressed to achieve independent color control. Thus, properly doped gallium aluminum phosphide can be made to luminesce either green or rod, and by the superposition of red and green emitting junctions, yellow emission may be created.

However, the technology known to date is not known to make available, spatially uniform visual displays of more than one color using a two-terminal multi-wavelength LED device with tunnel junction, wherein two or more colors are emitted from the same device.

SUMMARY OF THE INVENTION

It is a general object of the present invention to provide LED visual displays of more than one color.

A further object of the invention is to provide LED visual displays that are spatially uniform displays of more than one color.

A yet further object of the invention is to provide LED visual displays that are spatially uniform displays of more than one color emitted from the same device.

A still further object of the invention is to provide LED visual displays that are spatially uniform displays of more than one color emitted from the same device, wherein said device is a two-terminal device with tunnel junction.

In general, the multiple wavelength light emitting diode of the invention comprises a multiple layered, single structure of several LED's of varying band gaps, and is made by depositing thin films of alternating p-doped and n-doped materials, wherein the lowest band gap material is deposited first and the highest band gap material is deposited last. Electrical connections are then structured in place so that all of the n-p junctions can be collectively energized to emit simultaneously the corresponding wavelengths or colors. The device of the invention may be utilized to provide the three primary colors or emit them simultaneously to produce white light.

DETAILED DESCRIPTION OF THE INVENTION

A multi-wavelength diode is made by interconnecting two or more single diodes with one or more tunnel junctions or interconnects. Emission is then obtained by forward biasing the entire device. The primary requirements include individual diodes that are designed as they would be if used individually, an appropriate stacking order in which the highest band gap material is on the emitting face of the device, and transparent tunnel junctions or interconnects. The transparency of the tunnel junction or interconnect is at least as important as a very low contact resistivity since absorption in this layer will prevent emission of the long wavelength device, while resistance in this layer will increase the voltage required to energize the device. The requirements on this tunnel junction are far less stringent than for the high-efficiency solar cell described below.

As an example of the multi-wavelength LED we have used a monolithic, tandem solar cell. This device has been optimized for efficient conversion of sunlight to electricity, rather than conversion of electricity to sunlight. Nevertheless, it demonstrates the operation of the invention. The device was grown in a vertical, air-cooled reactor at one atmosphere using organometallic chemical vapor deposition (OMCVD). The group III source gases were trimethylindium, trimethylgallium, and trimethyaluminum; the group V source gases were arsine and phosphine. The dopant sources were diethylzinc and hydrogen selenide. The arsine and phosphine were purified on-line by passing them over a gettering compound. The optoelectronic properties and photovoltaic quality of the materials listed above are complex and coupled functions of the growth temperature Tg, the V/III ratio, composition, dopant type and concentration, and substrate quality. Generally, however, the cascade device is grown at Tg=700° C. The phosphides are grown with V/III=30 and a growth rate of 80-100 nm/minute; the arsenides, with V/III=35 and a growth rate of 120-150 nm/minute, with the exception the GaAs tunnel diode is grown at a rate of 40 nm/minute.

The absorbers of both subcells are doped with Zn to a level of $(1-4) \times 10^{17}$ cm$^{-3}$. The emitters and window layers are doped with Se at about $10^{18}$ cm$^{-3}$. Both layers of the GaAs tunnel diode are heavily doped at concentrations approaching $10^{19}$ cm$^{-3}$. Tunnel diodes grown under conditions simulating the fabrication of a full cascade device have a series resistance of $10^{31}$ 3–$10^{-2}$ cm$^2$, and are relatively stable at 700° C. for at least 30-40 minutes.

Figure 5:
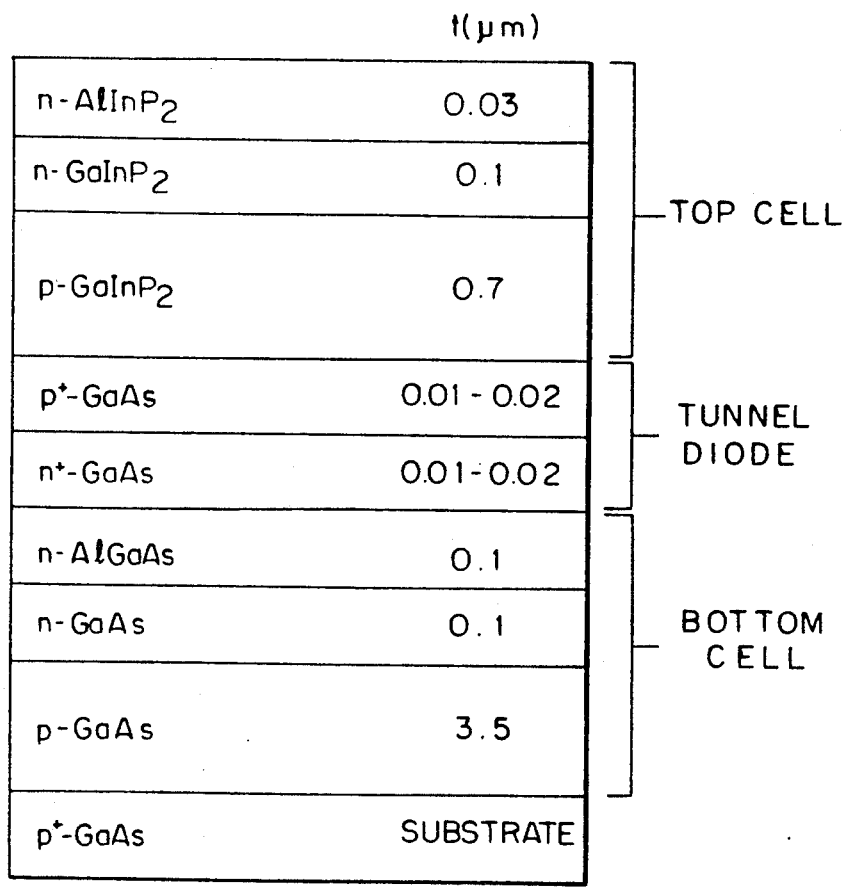
FIG. 5 is a schematic cross-section of a GaInP$_2$/GaAs tandem structure contemplated by the invention.

The front and back contacts of these devices were electroplated gold. Because of the high dopant concentration in both the GaAs substrate and the top GaAs contacting layer (not shown in the FIG. 5), no thermal annealing of either contact is required. The front contact is defined by photolithography and obscures approximately 5% of the total cell area. The cell perimeter is also defined by photolithography and a mesa etch that uses a sequential combination of concentrated hydrochloric acid and an ammonia perioxide:water solution. The ammonia/peroxide solution is also used to remove the GaAs contacting layer between the gold grid fingers. The antireflection coating (ARC) is a double layer of evaporated ZnS and MgF$_2$, with thicknesses of 60 and 120 nm, respectively.

Figure 1:
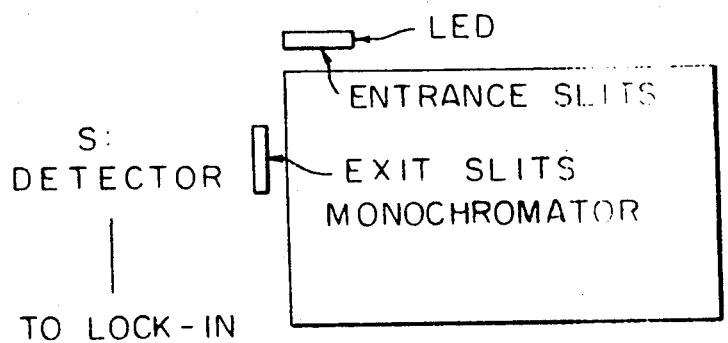
FIG. 1 is a simplified schematic of a monochromator for detecting emissions of wavelengths.
Figure 4:
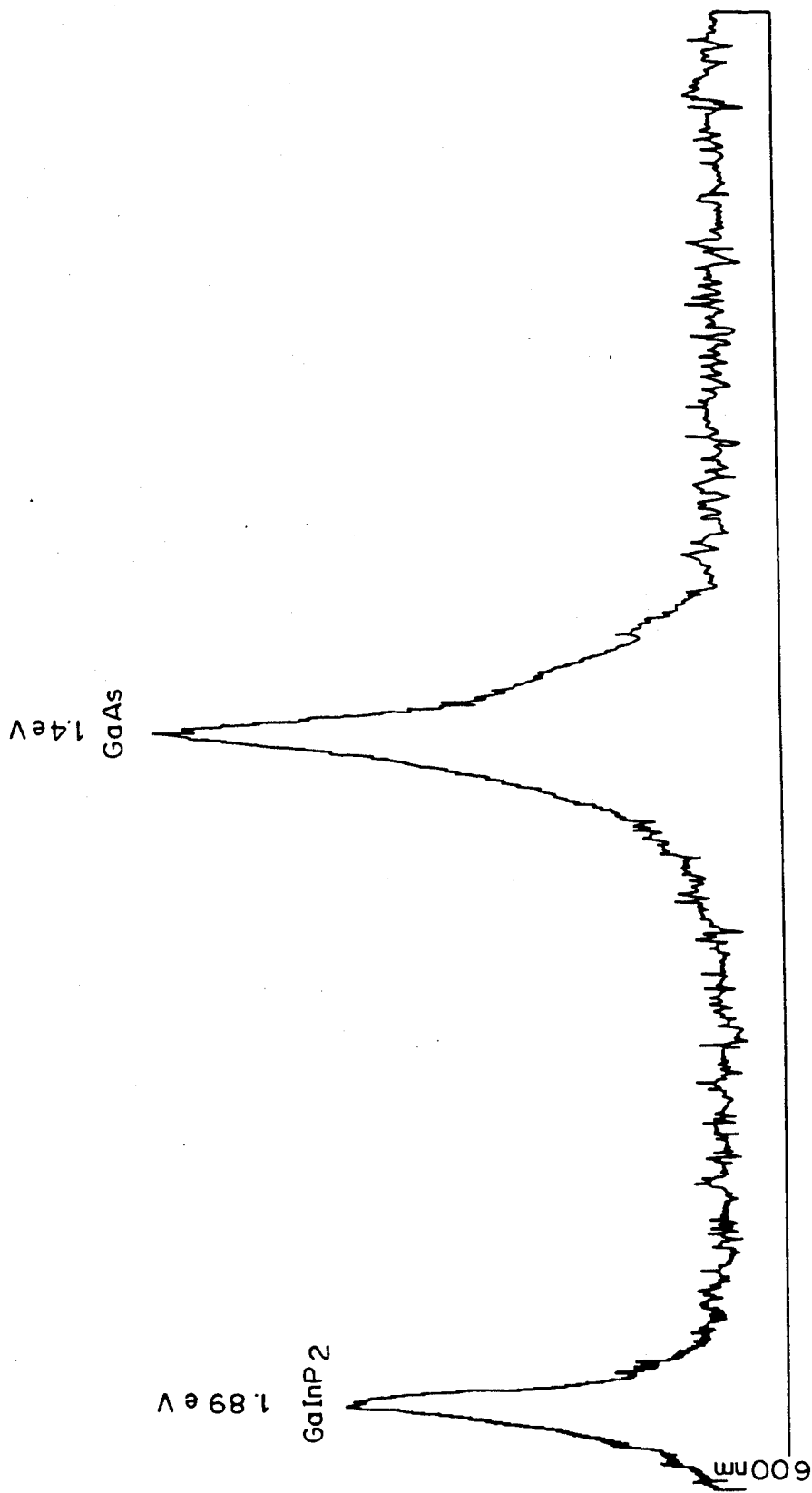
FIG. 4 is a scan showing emission of two different wavelengths for the diode of FIG. 5.

The emission of light of two wavelengths from this device was observed with a system as shown in FIG. 1. A modulated voltage was applied in addition to a DC forward-biasing voltage. The emission was analyzed by placing the device at the entrance of a monochromator and a silicon photo-detector at the exit of the same monochromator. A lock-in amplifier, tuned to the wavelength of the modulation, was used to enhance the sensitivity of the detection. FIG. 4 shows a scan having emission at two different wavelengths for the diode of FIG. 5, which shows a cross-section of a GnInP$_2$/GaAs tandem structure of the invention. The higher energy peak, observed at an energy of 1.89 eV, corresponds to the emission obtained from a single-junction diode fabricated from Ga$_{0.5}$In$_{0.5}$P. The lower energy peak, observed at an energy of 1.4 eV, corresponds to the emission obtained from a single-junction diode fabricated from GaAs.

Figure 2:
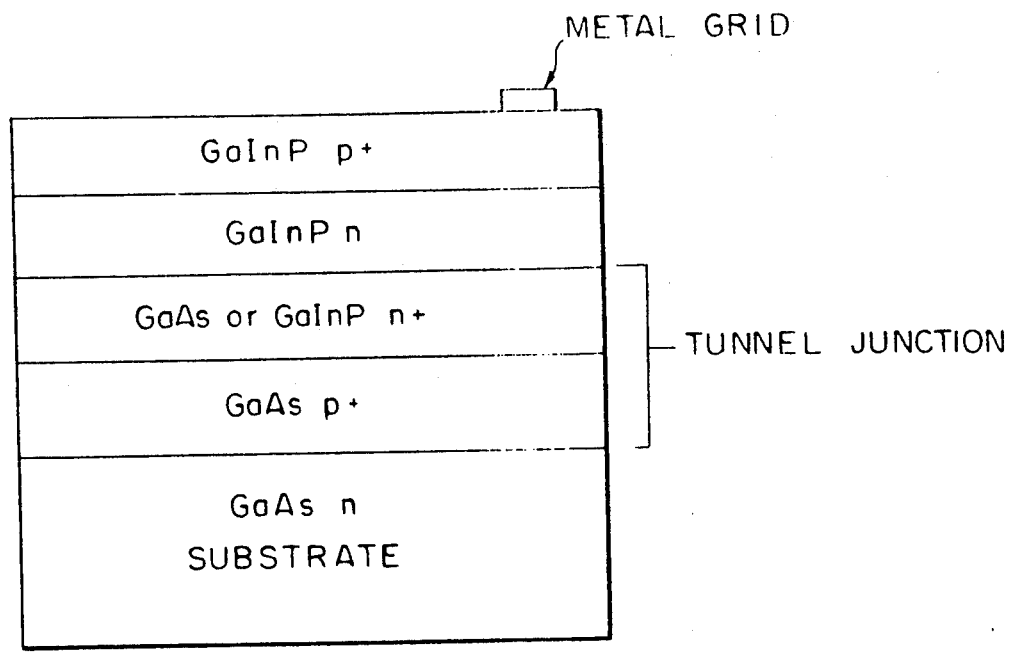
FIG. 2 is a simplified schematic of a generic tandem cell of GaAs/GaInP having a tunnel junction of GaAs or GaInP n+ and GaAs p+.
Figure 3:
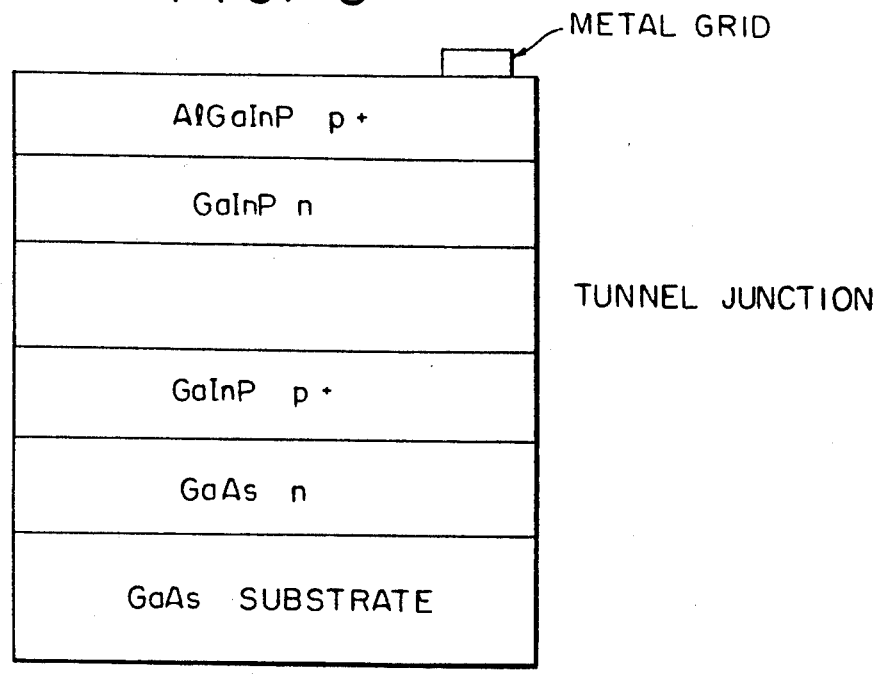
FIG. 3 is a simplified schematic of another hetero structure of a tandem cell useful in the invention.

Other hetero structures having a tunnel junction, and which are equally operable in the context of the invention are shown in FIG. 2, which is a schematic of a generic tandem cell of GaAs./GaInP having a tunnel junction of GaAs or GaInPn+ and GaAsp+, and FIG. 3, which is a schematic of another hetero structure of a tandem cell of the invention.

The invention, in adding multiple layers to arrive at several LED's of varying band gaps that are combined into one structure permit two or more colors to be emitted in spatially uniform displays from the same device.

It is to be understood that the foregoing method for providing an LED visual display that is a spatially uniform display of more than one color emitted from the same device, wherein said device is a two-terminal device with tunnel junction is given by way of illustration only and is not meant to limit the method of making these structures. It should also be appreciated that the number of layers need not be limited to those illustrated herein, but can be altered to achieve a multiplicity of spatially uniform displays of more than one color emitted from the same device.

What is claimed is:

1. A multiple wavelength light-emitting diode having a monolithic cascade cell structure comprising: diodes having at least two p-n junctions, wherein each of said at least two p-n junction diodes are top and bottom cells having substantially different band gaps; electrical connector means by which said at least two p-n junctions may be collectively energized; and a transparent tunnel p-n junction interconnecting said diodes of substantially different band gaps.

2. A diode structure as in claim 1, wherein said monolithic cascade cell structure comprises GaInP$_2$/GaAs as top/bottom cells.

3. The diode of claim 1, wherein said monolithic cascade cell structure comprises AlGaInP/GaAs as top/bottom cells.

4. The diode of claim 1, wherein said diode is a two-terminal monolithic cell and said structure consists of Ga$_{0.5}$In$_{0.5}$P grown epitaxially upon GaAs as a bottom cell, and said transparent tunnel junction is of GaInP n+/GaAs p+.

5. The diode of claim 1, wherein said diode is a two-terminal monolithic cell structure that consists of Ga$_{0.5}$In$_{0.5}$P grown epitaxially upon GaAs as a bottom cell, and said transparent tunnel junction is of GaAs n+/GaAs p+.

6. The diode of claim 2, wherein the tunnel p-n junction is GaAs n+/GaAs p+.

7. The diode of claim 3, wherein the tunnel p-n junction is GaAs n+/GaAs p+.

8. The diode of claim 4, wherein the tunnel p-n junction if GaAs n+/GaAs p+.

9. The diode of claim 1, comprising: a top cell of n-AlInP$_2$ of about 0.03 $\mu$m thickness, n-GaInP$_2$ of about 0.1 $\mu$m thickness and p-GaInP$_2$ of about 0.7 $\mu$m thickness;

a tunnel junction of p+GaAs of between about 0.01-0.02 $\mu$m thickness and n+GaAs of between about 0.01-0.02 $\mu$m thickness; and a bottom cell of n-AlGaAs of about 0.1 $\mu$m thickness, n-GaAs of about 0.1 $\mu$m thickness and p-GaAs of about 3.5 $\mu$m thickness.

* * * * *